(12) United States Patent
Becker et al.

(10) Patent No.: US 6,285,095 B1
(45) Date of Patent: Sep. 4, 2001

(54) AUTOMATIC COMPENSATION OF AN AC ATTENUATOR USING A DIGITAL TO CAPACITANCE CONVERTER

(75) Inventors: Alvin G. Becker; Paul A. Lennous, both of Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 09/488,163

(22) Filed: Jan. 20, 2000

(51) Int. Cl.[7] .................................................. H01H 47/00
(52) U.S. Cl. ............................................ 307/125; 307/129
(58) Field of Search ..................................... 307/112, 116, 307/125, 128, 129; 327/337; 361/299.1, 306.1

(56) References Cited

U.S. PATENT DOCUMENTS

| | | | |
|---|---|---|---|
| 3,605,000 | * | 9/1971 | Inaba et al. ........................... 318/619 |
| 3,654,547 | * | 4/1972 | Julie ...................................... 323/233 |
| 4,663,586 | * | 5/1987 | Swerlein et al. ..................... 324/115 |
| 5,696,662 | | 12/1997 | Bauhahn . |
| 5,880,921 | | 3/1999 | Tham et al. . |
| 5,905,398 | | 5/1999 | Todsen et al. . |
| 5,933,013 | * | 8/1999 | Kimura ................................. 324/601 |

* cited by examiner

*Primary Examiner*—Adolf Deneke Berhane
(74) *Attorney, Agent, or Firm*—Conley, Rose & Tayon PC; Jeffrey C. Hood

(57) ABSTRACT

An AC attenuator system including a compensation circuit for providing a selectable trimming impedance for the AC attenuator. The compensation circuit comprises a plurality of capacitors preferably coupled in parallel with a portion of the attenuator, wherein the capacitors have binary weighted values. The compensation circuit also includes a plurality of switches, wherein each switch is coupled to an input of each of the plurality of capacitors and is further coupled to the AC attenuator circuit. The switches are preferably microelectronic machined system (MEMS) switches. The compensation circuit further includes a memory element coupled to the plurality of switches. The memory element stores a value, preferably a digital or binary value, which is operable to open/close selected switches. The value stored in the memory element is provided to the switches during power on, thereby opening/closing selected switches and configuring a capacitance value among the plurality of capacitors for compensation of the AC attenuator system. The compensation circuit thus produces a selectable trimmer impedance for the AC attenuator.

22 Claims, 6 Drawing Sheets

AUTOMATIC COMPENSATION OF AN AC ATTENUATOR USING A DIGITAL TO CAPACITANCE CONVERTER

BACKGROUND OF THE INVENTION

1. Field of the Invention

The present invention relates to analog attenuators used in the measurement of AC signals, and more particularly to automatic compensation of the AC attenuator using a digital to capacitance converter for improved frequency response of the AC attenuator.

2. Description of the Related Art

Scientists and engineers often use instrumentation or data acquisition systems to perform a variety of functions, including test and measurement, laboratory research, process monitoring and control, data logging, analytical chemistry, test and analysis of physical phenomena, and control of mechanical or electrical machinery, to name a few examples.

A typical analog measurement instrumentation system includes signal conditioning logic which amplifies low-level signals, attenuates high level signals, and also isolates and filters signals for more accurate and safe measurements.

More specifically, a typical analog measurement system includes an AC amplifier/attenuator which either amplifies or attenuates a received analog signal depending upon the level of the signal being measured. An AC attenuator comprises two resistors that form a voltage divider to reduce the input voltage to a smaller value. The AC attenuator essentially comprises one very large resistor and one very small resistor coupled in series. The majority of the voltage appears across the larger resistor and a much smaller voltage appears across the smaller resistor wherein this voltage is measured as the output of the AC attenuator. For example, in the case of 100 to 1 AC attenuator, the large resistor is 99 times greater than the small resistor and thus 1% of the voltage appears across the smaller resistor. An example prior art voltage divider is shown in FIG. 1.

AC attenuators generally have a limited bandwidth. In other words, the frequency response of an AC attenuator is flat for a portion of the bandwidth, but is nonlinear at higher frequencies. The reason for this is that a stray or parasitic capacitance exists around the large resistor and the attenuator. At high frequencies, this parasitic capacitance forms a linkage path around the larger resistor. This parasitic capacitance also exists across the small resistor. However, its effect is much less with respect to the small resistor due to the much smaller resistance provided by the small resistor. This parasitic capacitance across each of the small and large resistors can be modeled as a capacitor coupled in parallel with each of the respective resistors. This parasitic capacitance is shown in FIG. 1 as the capacitors C1 and C2.

As the frequency of the AC signal increases, these capacitors have reduced impedance, thus essentially short circuiting the resistors in the AC attenuator. Thus, at high frequencies the small impedance offered by the parasitic capacitance affects the proper operation of the voltage divider, providing a nonlinear frequency response and thus producing inaccurate results.

As shown in FIG. 2, as the frequency of the AC signal increases, the overall impedance offered by the larger resistor becomes less and thus the attenuation factor is not as great. Thus, the output voltage starts rising, e.g., at 20 khz. The voltage continues to rise until the parasitic capacitance around the smaller resistor begins to take affect, which is generally at 100 times the frequency where the non-linearity begins for a 100 to 1 AC attenuator. At this point, the output voltage stops rising and flattens out to a new value, which essentially is the ratio between the impedance of the capacitors. At this point, the resistors are no longer significant because the capacitors offer less impedance.

FIG. 3 illustrates an AC attenuator which includes compensation according to the prior art. As shown, the AC attenuator of FIG. 3 includes a small resistor (10K ohms) and a large resistor (1 MEG ohms), thus forming a 100 to 1 attenuator. The capacitors C1 and C2 represent the parasitic capacitance that occurs at higher frequencies. In order to compensate for this parasitic capacitance, prior art systems incorporate a capacitor C3 across the smaller resistor. In the case of a 100 to 1 attenuator, the capacitor C3 would generally have a value that is 100 times greater than that of C1. The capacitor C3 operates to effectively cancel out the parasitic impedance so that the frequency or roll off of the lower portion of the attenuator occurs at the same frequency that the upper portion of the attenuator rolls off. Thus, this effectively forms two attenuators: a resistive attenuator comprising the small and large resistors that operates at low frequencies, e.g., up to 20 kilohertz, and a capacitive attenuator which operates at larger frequencies.

One problem which arises is that the resistive attenuator and the capacitive attenuator are not truly identical in their attenuation ratios, this being because they are comprised of components that have uncertain tolerances. In order to compensate for this difference and properly calibrate the resistive and capacitive attenuation components, prior art systems have added another capacitor C4, which is a variable capacitor. In this system, capacitor C3 is slightly smaller than necessary, and the variable capacitor C4 is included to add the proper amount of capacitance to compensate for the uncertain tolerances. Thus, during manufacture of the AC attenuator, the technician adjusts the capacitance of the adjustable capacitor C4 until the capacitive attenuator and the resistive attenuator have substantially identical attenuation ratios. This calibration operates by providing a known reference signal into the AC attenuator, measuring the output, and then adjusting the capacitor accordingly to achieve ideal results.

U.S. Pat. No. 4,663,586 titled "Device with Automatic Compensation of an AC Attenuator" describes an AC attenuator system with an electronic mechanism for compensating an AC attenuator. The system of U.S. Pat. No. 4,663,586 is also shown in FIG. 4. This system operates to create a scaled replica of the voltage appearing at the output of the attenuator using a multiplying amplifier and a gain component. The output of the attenuator is then driven with the scaled replica to a virtual trimmer impedance, e.g., capacitor C3, the effective value of the virtual trimmer impedance is then varied by changing the scale of the replica until the proper gain value is obtained. This gain value is then programmed for usage in the AC attenuator to provide the proper compensation.

Therefore, further improved systems and methods are desired for providing automatic compensation of an AC attenuator system.

SUMMARY OF THE INVENTION

The present invention comprises an AC attenuator system including a compensation circuit for providing a selectable trimming impedance for the AC attenuator. The AC attenuator preferably comprises a voltage divider having first and second resistors. The voltage divider receives an input analog signal and produces an attenuated version of the input analog signal.

The compensation circuit comprises a plurality of capacitors preferably coupled in parallel with the second resistor. The plurality of capacitors have weighted values, preferably binary weighted values. The compensation circuit also includes a plurality of lo switches, wherein each switch is coupled to an input of each of the plurality of capacitors and is further coupled to the AC attenuator circuit. The switches are preferably microelectronic machined system (MEMS) switches. The compensation circuit further includes a memory element coupled to the plurality of switches. The memory element stores a value, preferably a digital or binary value, which is operable to open/close selected switches. At power up of the AC attenuator system, the memory element is operable to output the value to the plurality of switches to open/close selected switches, thereby configuring a capacitance value among the plurality of capacitors for compensation of the AC attenuator system. The compensation circuit thus produces a selectable trimmer impedance for the AC attenuator. The compensation circuit thus essentially comprises a digital to capacitance converter.

The present invention further comprises a method of compensating the frequency response of an attenuator. The method first comprises storing a value in a memory element, wherein the value controls an open/closed state of a plurality of switches. The method then comprises the memory element providing the value to the plurality of switches, preferably at power on, to selectively open/close the plurality of switches. In response to the memory element providing the value, the switches selectively couple a plurality of capacitors having different weighted values to the attenuator, thereby configuring a virtual trimmer impedance for the attenuator. During calibration, the above steps are performed one or more times to determine an optimum value for compensating the frequency response of the attenuator. After calibration has been completed, the optimum value is stored in the memory element for use as described above.

The present invention further comprises a digital to capacitance converter as described above for selectively configuring a capacitance value for a circuit.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Instrumentation System

Figure 5:
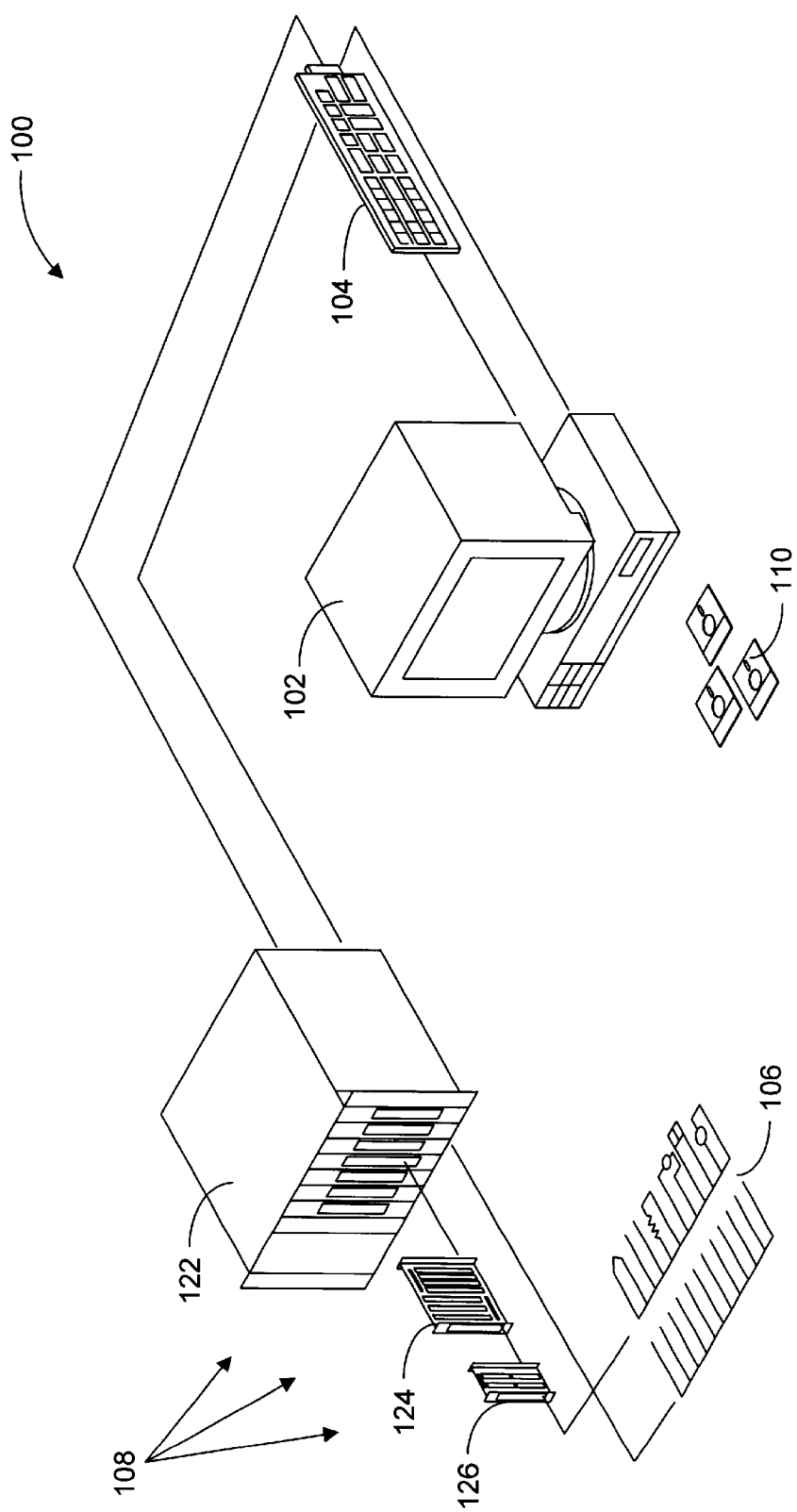
FIG. 5 illustrates a computer-based measurement system according to the preferred embodiment of the present invention.

FIG. 5 illustrates a computer-based instrumentation system 100 according to one embodiment of the present invention. The AC attenuator system of the present invention is comprised in the computer-based instrumentation system 100 in the preferred embodiment. However, the AC attenuator system of the present invention may also be comprised in a standard handheld or benchtop instrument, such as a standard multimeter or other instrument, or in any of various other systems which use AC signal attenuation. Thus FIG. 5 is illustrative only, and various other embodiments are contemplated.

The instrumentation system 100 comprises a computer 102 having an operating system and other software, an instrumentation device or board 104 coupled to the computer 102, and transducers 106 or other detecting means which provide field electrical signals to/from the instrumentation device 104 through signal conditioning logic 108.

Figure 1:
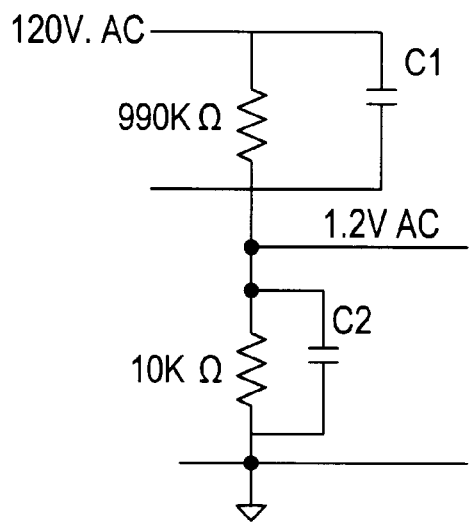
FIG. 1 illustrates a prior art voltage divider forming an AC attenuator.
Figure 2:
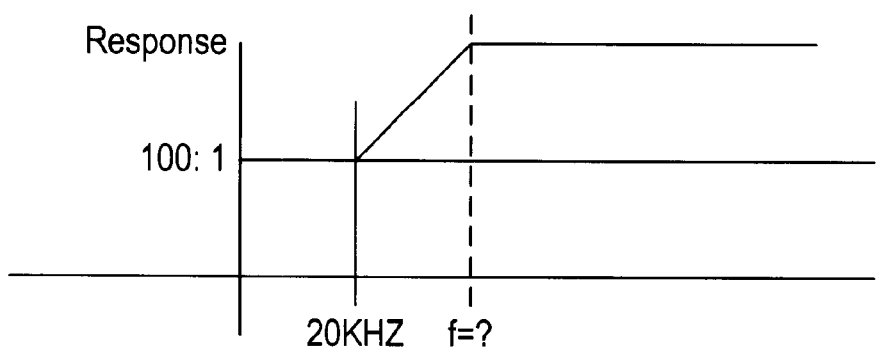
FIG. 2 illustrates the frequency response of an AC attenuator without compensation.
Figure 3:
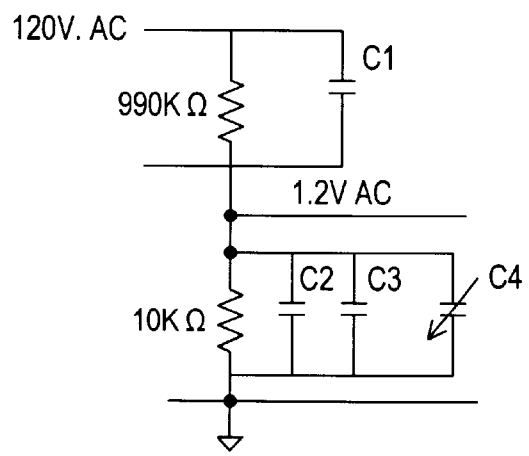
FIG. 3 illustrates a prior art AC attenuator using an adjustable capacitor for compensation.
Figure 4:
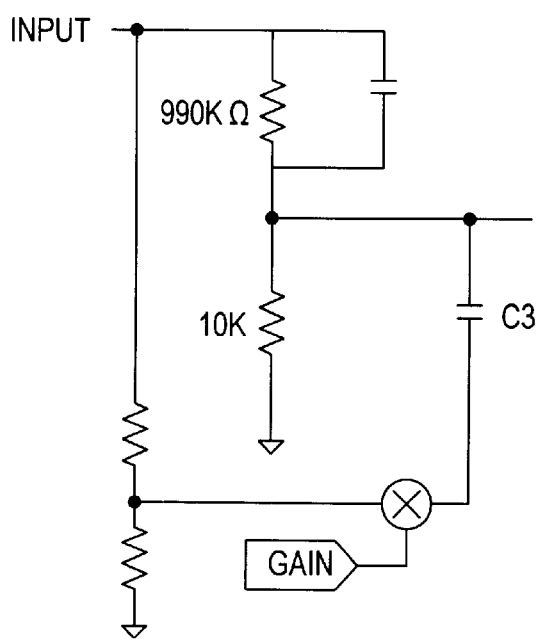
FIG. 4 illustrates a prior art AC attenuator using automatic compensation.

The computer 102 includes various standard components, including at least one central processing unit (CPU), memory, a hard drive, one or more buses, and a power supply. The computer also stores software programs, represented by media 110. In one embodiment, the computer 102 comprises input/output (I/O) slots into which the instrumentation device 104 is coupled. In the embodiment of FIG. 1, the instrumentation device 104 is a board or card adapted for insertion into an expansion slot of the computer system 102. The board 104 is shown external to the computer system 102 in FIG. 1 for illustrative purposes. In another embodiment, the instrumentation device 104 is coupled to the computer 102 by a VXI (VME Extensions for Instrumentation) chassis and bus, a GPIB (General Purpose Interface Bus), a serial bus or port or a parallel port. The instrumentation device 104 may be any of various types, such as a data acquisition (DAQ) device or card, a multimeter card, a voltmeter card, etc. The instrumentation device 104 preferably includes the AC attenuation system of the present invention.

The transducers 106 are conditioned by the signal conditioning circuitry 108 for presentation to the DAQ device 20 as shown. In the embodiment of FIG. 1, the signal conditioning circuitry 108 comprises an SCXI (Signal Conditioning Extensions for Instrumentation) chassis 122, one or more SCXI modules 124, and one or more SCXI terminal blocks 126. SCXI is an open architecture, multi-channel signal conditioning frontend end system for instrumentation devices. SCXI comprises an external chassis housing signal conditioning modules for amplifying, multiplexing, and isolating field signals. The signal conditioning modules advantageously reduce the introduction of noise into the signals transmitted to the DAQ device 104. In one embodiment, the AC attenuation system of the present invention is comprised in a signal conditioning module 124 comprised in the SCXI chassis 122.

The transducers 106 and other detecting means provide the field signals representing a process, physical phenomena, equipment being monitored or measured, etc. to/from the instrumentation device 104. Examples of the transducers 106 are strain gauges, thermocouples, thermistors, photoconductive cells, microphones, and piezoelectric transducers, among others.

Figure 6:
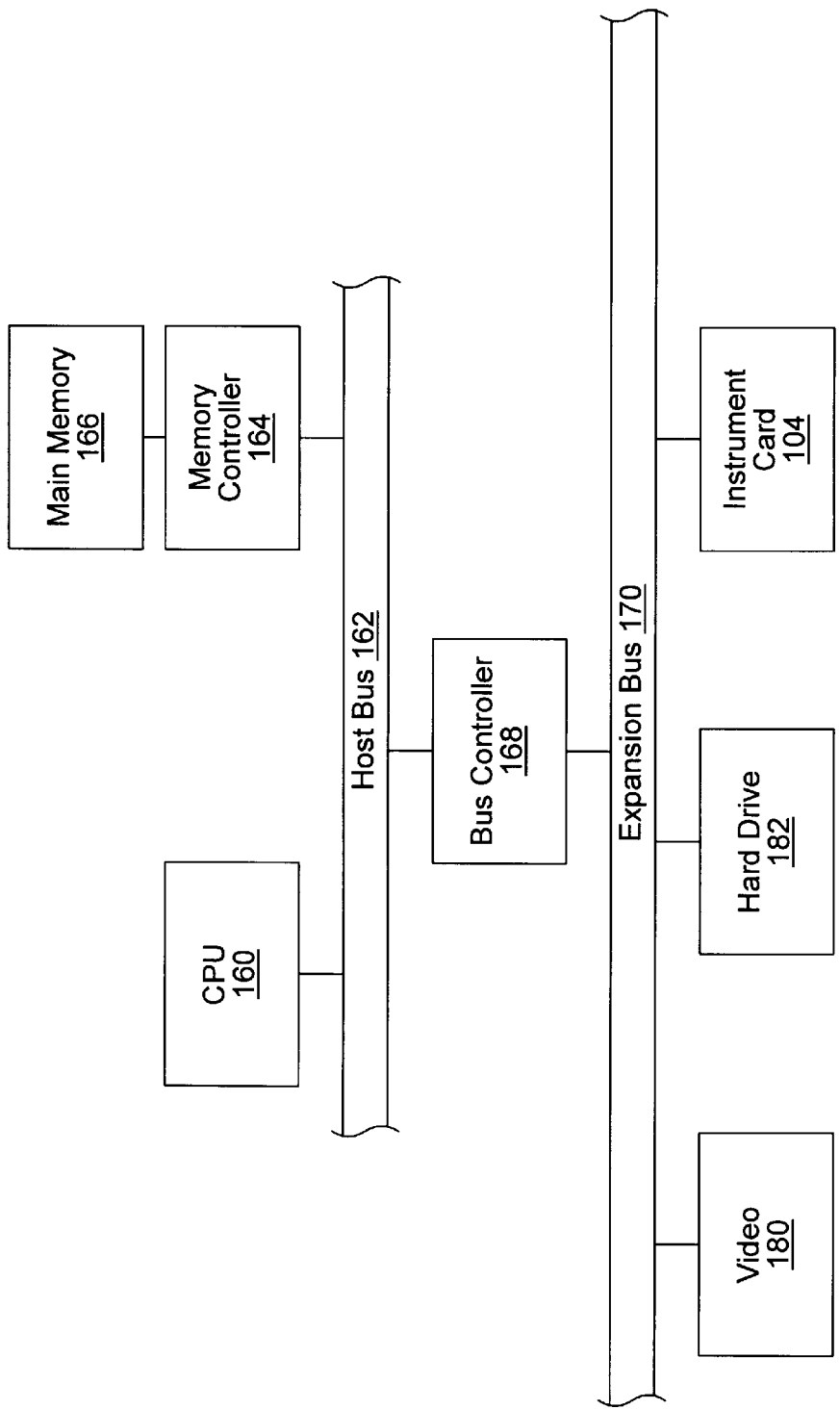
FIG. 6 is a block diagram of the computer-based measurement system of FIG. 5.

FIG. 6—Computer Block Diagram

FIG. 6 is a block diagram of the computer system 102 of FIG. 5. The elements of a computer not necessary to understand the operation of the present invention have been omitted for simplicity. The computer 102 includes at least one central processing unit or CPU 160 which is coupled to a processor or host bus 162. The CPU 160 may be any of various types, including an x86 processor, a PowerPC processor, a CPU from the Motorola family of processors, a CPU from the SPARC family of RISC processors, as well as others. Main memory 166 is coupled to the host bus 162 by means of memory controller 164. The main memory 166 may store application software for controlling the instrumentation system. The main memory 166 also stores operating system software as well as other software for operation of the computer system, as well known to those skilled in the art.

The host bus 162 is coupled to an expansion or input/output bus 170 by means of a bus controller 168 or bus bridge logic. The expansion bus 170 is preferably the PCI (Peripheral Component Interconnect) expansion bus, although other bus types can be used. The expansion bus 170 includes slots for various devices such as the instrumentation board 104. The instrumentation board 104 may comprise a data acquisition board, a multimeter board, i.e., a board which implements multimeter functions, an oscilloscope board, or other type of instrumentation board. The computer 102 further comprises a video display subsystem 180 and hard drive 182, which may be coupled to the expansion bus 170.

As noted above, the instrumentation device 104 preferably includes the AC attenuation system of the present invention.

Figure 7:
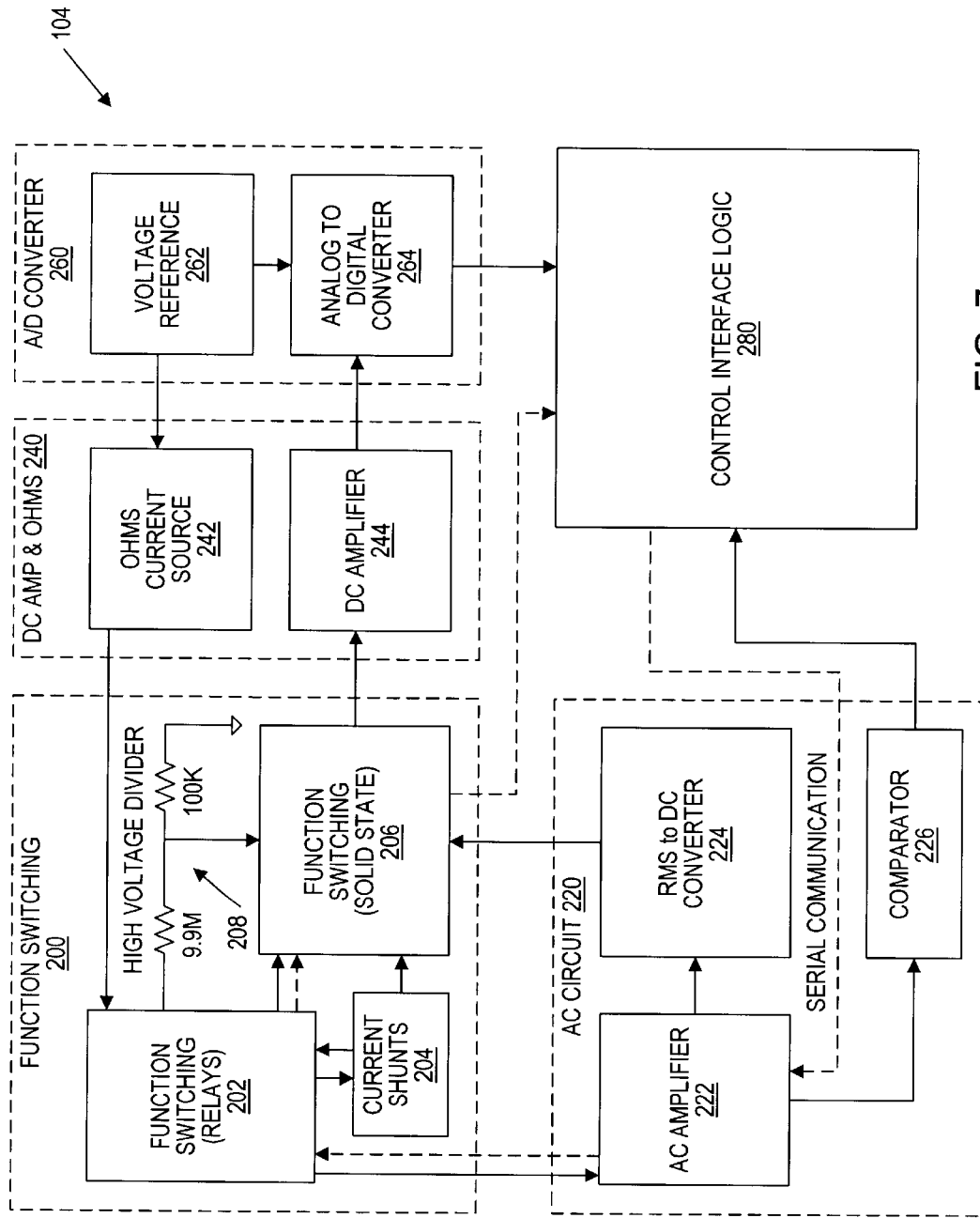
FIG. 7 is a block diagram of the instrumentation device of FIG. 6.

FIG. 7—Multimeter Block Diagram

FIG. 7 is a block diagram illustrating a portion of the instrumentation device 104 of FIG. 6, wherein the instrumentation device 104 is a multimeter. It is noted that FIG. 7 is exemplary only, and the instrumentation device 104 may have various architectures or forms, as desired. Also, as noted above, the AC attenuation system of the present invention may be included in any of various devices, as desired.

As shown, the instrumentation device 104 includes a function switching block 200, an AC circuit 220, a DC amplifier and ohm block 240, an A/D converter block 260 and control interface logic 280.

The function switching block 200 operates to switch between the various functions performed by the multimeter, such as voltage measurement, current measurement, DC/AC measurements, etc. The function switching logic 200 includes a function switching block 202 comprising a plurality of relays. The function switching block 202 couples to a high voltage divider 208. The function switching block 202 also couples to current shunts 204. The current shunts block 204 couples to function switching logic 206, which preferably comprises solid state logic.

The function switching block 202 also couples to the AC circuit 220. More specifically, the function switching block 202 couples to an AC amplifier 222. The AC amplifier 222 includes the AC attenuator system and method of the present invention. As discussed further below, the AC attenuator system and method operates to provide improved frequency response, e.g., a more flat frequency response, for the AC attenuator comprised in the AC amplifier 222. The AC amplifier provides an output to a comparator 226. The comparator 226 in turn provides an output to the control interface logic 280. The AC amplifier 222 is also preferably in serial communication with the control interface logic 280.

The AC amplifier 222 also provides an output to an RMS to DC converter 224. The RMS to DC converter 224 operates to convert a root means square (RMS) to a DC value. The RMS to DC converter 224 provides its output to the solid state function switching logic 206.

As shown, the instrumentation device also includes the DC amplifier and ohm section 240. This block includes an ohms current source 242 and a DC amplifier 244. The instrumentation device 104 also includes the A/D converter block 260. The A/D converter block 260 includes a voltage reference block 262 and an analog to digital (A/D) converter 264. The voltage reference block 262 provides an output to the ohms current source block 242 which in turn provides an output to the function switching relays 202. The solid state function switching block 206 receives an output from the high voltage divider 208 as well as from the relay function switching logic 202 and the current shunts 204 and provides an output to the DC amplifier 244 which in turn provides an output to the A/D converter 264. The solid state function switching block 206 and the A/D converter 264 are also coupled to the control interface logic 280.

The control interface logic 280 includes logic for controlling access to the computer display for displaying the acquired signals. For example, the control interface logic 280 includes expansion bus interface logic, e.g., PCI bus interface logic, for interfacing to the PCI expansion bus 170.

Figure 8:
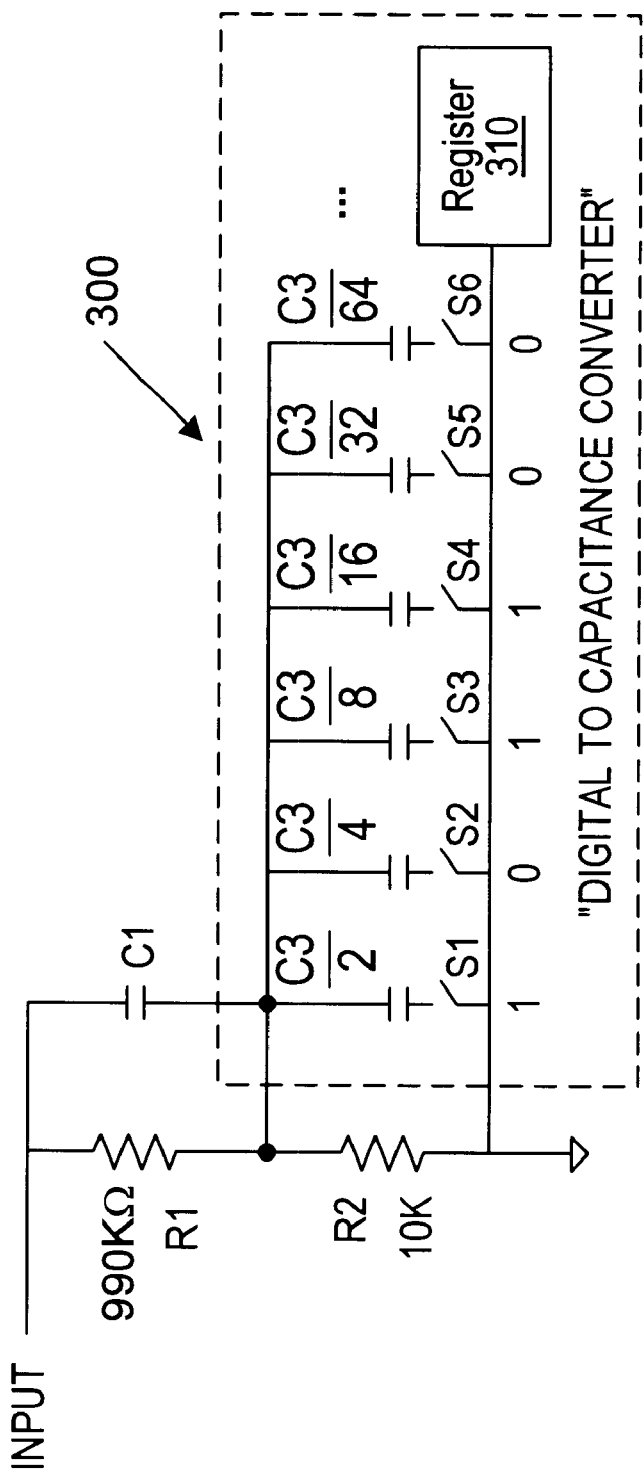
FIG. 8 illustrates an AC attenuator including compensation for improved frequency response according to the preferred embodiment of the present invention.

FIG. 8—AC Attenuator of the Preferred Embodiment

FIG. 8 illustrates the AC attenuation system and method of the present invention. As noted above, the AC attenuation system is preferably comprised in the AC amplifier 222 of FIG. 7.

As shown, the AC attenuator includes an input which receives the analog signal. The AC attenuator also includes a voltage divider including a first resistor R1 and a second resistor R2. In the embodiment shown in FIG. 8, the voltage divider is a 100:1 voltage divider. Thus, the resistor R1 is 100 times greater than R2. In this embodiment, the resistor R1 has a 990 K ohm value and the resistor R2 has a 10 K ohm value. A capacitor C1 is coupled in parallel with the resistor R1.

The AC attenuator of the present invention utilizes a "digital to capacitance converter" 300 for automatically compensating the attenuator. The digital to capacitance converter 300 comprises a plurality of capacitors connected in parallel, wherein the capacitance values are weighted to achieve a selectable capacitance. The plurality of capacitors are selectively connected in parallel with the resistor R2, thus providing a selected impedance to the circuit.

In the preferred embodiment, the capacitors are binary weighted wherein a first capacitor has a value C3/2, a second capacitor has a value C3/4, a third capacitor has a value C3/8, a fourth capacitor has a value C3/16, etc. The capacitance value C3 preferably represents an estimate of the maximum capacitance value that would be desired for the plurality of capacitors. The plurality of capacitors may be weighted in any of various ways to achieve a selectable capacitance, as desired. For example, a tertiary weighting or non-uniform weighting may be used, as desired.

The digital to capacitance converter 300 also includes a plurality of switches S–Sn which are coupled to an input of each of the capacitors. The number of switches S corresponds to the number of capacitors. The switches S–Sn are also connected to ground. Thus, when a switch S is closed for a respective capacitor, the respective capacitor is connected to the circuit. The capacitors of the digital to capacitance converter 300 are selectively connected to the attenuator through control of the switches S–Sn, preferably through digital control of the switches. The digital control value used to control connection of the capacitors may be varied for each attenuator setting.

In the preferred embodiment, the switches are microelectronic machined systems (MEMS) switches. MEMS switches are used in the preferred embodiment because they have very low parasitic capacitance and have very good characteristics. The MEMS switches have a low "on resistance", which is the resistance of the switch when it is turned on or in a closed state. The MEMS switches as well as the capacitors are preferably comprised in a single integrated circuit to achieve common electrical characteristics among the devices. In an alternate embodiment, solid state switches are used instead of the MEMS switches.

The digital to capacitance converter 300 also preferably includes a memory element 310, such as a register, which stores a value, preferably a digital value, which is used to control the switches S–Sn. The memory element 310 is coupled to each of the switches S–Sn and provide a digital control value to control the state of the switches S1–Sn. The digital control value is preferably a binary value of length equal to the number of capacitors. The digital control value comprises a binary value comprising 1s and 0s, wherein the 1s and 0s indicate whether respective switches should be opened or closed. During calibration, the digital control value may be varied to achieve an optimum value which produces the best possible performance for the attenuator, and then this optimum digital control value is preferably stored in the memory 310 for future use.

Thus, the adjustable capacitance is provided by a plurality of parallel capacitors which have differing weighted values, a plurality of corresponding switches, and a register which stores a control value for controlling the states of the switches and hence controlling the capacitance value produced. This value is determined and stored at manufacturing time during calibration of the AC attenuator system in the multimeter. Thus, every time the multimeter is powered on, the stored value is loaded into the respective switches to close and open the respective switches to provide the appropriate trimming impedance for the AC attenuator.

In the preferred embodiment, the digital to capacitive converter 302 is calibrated as follows. First, the user selects a binary digital control value to apply to the switches. For example, the binary value may comprise "10101", wherein the 1 indicates a closed switch and the 0 indicates an open switch. This produces a certain capacitance value when applied to the respective capacitors. This value may or may not properly compensate the attenuator. After the user determines the compensation provided by this first binary value, the user preferably determines if more or less capacitance is needed, selects a different binary value and again makes a determination. The user may perform this iteration one or more times to zero in on the proper digital value which provides the best AC attenuation compensation. Thus, the user can determine from the results whether the capacitance should be increased or decreased and can adjust the digital value accordingly to decrease or increase the capacitance respectively. Thus, this method operates to vary the number and type of capacitors used in the compensation until the optimum digital control value is determined which substantially correctly compensates the attenuator. This binary number is then stored in the memory 310. Thus, every subsequent time that the multimeter device is powered up, this binary number is retrieved from the register 310 and used to close the correct switches S1–S6. It is also noted that the AC attenuator can be recalibrated at later times, thus possibly producing a different binary number which is stored in the register 310.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. An AC attenuator system, comprising:

a voltage divider comprising first and second resistors, wherein the voltage divider receives an input analog signal and produces an attenuated version of the input analog signal; and a plurality of capacitors coupled in parallel with the second resistor, wherein the plurality of capacitors have weighted values;

a plurality of switches, wherein a switch is coupled to an input of each of the plurality of capacitors;

a memory element coupled to the plurality of switches, wherein the memory element stores a value which is operable to open/close selected switches, thereby configuring a capacitance value among the plurality of capacitors for compensation of the AC attenuator system.

2. The AC attenuator system of claim 1, wherein, in response to power up of the AC attenuator system, the memory element is operable to output the value to the plurality of switches to open/close selected switches.

3. The AC attenuator system of claim 1, wherein the plurality of capacitors are binary weighted.

4. The AC attenuator system of claim 1, wherein the plurality of switches are microelectronic machined system (MEMS) switches.

5. The AC attenuator system of claim 1, wherein the memory element stores a binary value comprising 1s and 0s, wherein the 1s and 0s indicate whether respective switches should be opened or closed.

6. A system for compensating an AC attenuator, comprising:

a plurality of capacitors having weighted values, wherein the plurality of capacitors are adapted to be coupled in parallel with a resistor of the AC attenuator;

a plurality of switches, wherein a switch is coupled to an input of each of the plurality of capacitors;

a memory element coupled to the plurality of switches, wherein the memory element stores a value which is operable to open/close selected switches, thereby configuring a capacitance value among the plurality of capacitors for compensation of the AC attenuator.

7. The system of claim 6, wherein, in response to power up, the memory element is operable to output the value to the plurality of switches to open/close selected switches.

8. The system of claim 6, wherein the plurality of capacitors are binary weighted.

9. The system of claim 6, wherein the plurality of switches are microelectronic machined system (MEMS) switches.

10. The system of claim 6, wherein the memory element stores a binary value comprising 1s and 0s, wherein the 1s and 0s indicate whether respective switches should be opened or closed.

11. A method of compensating frequency response of an attenuator, comprising the steps of:

storing a value in a memory element, wherein the value indicates an open/closed state of a plurality of switches;

the memory element providing the value to the plurality of switches to selectively open/close the plurality of switches;

the switches selectively coupling a corresponding plurality of capacitors having different weighted values to the attenuator in response to the memory element providing the value, thereby configuring a virtual trimmer impedance for the attenuator.

12. The method of claim 11, wherein the memory element provides the value to the plurality of switches in response to power up of the attenuator.

13. The method of claim 11, wherein the plurality of capacitors are binary weighted.

14. The method of claim 11, wherein the plurality of switches are microelectronic machined system (MEMS) switches.

15. The method of claim 11, wherein said storing comprises storing a binary value in the memory element, wherein the binary value comprises 1s and 0s, wherein the 1s and 0s indicate whether respective switches should be opened or closed;

wherein the memory element provides the binary value to the plurality of switches to selectively open/close the plurality of switches.

16. The method of claim 11, further comprising:

repeating said steps of storing, providing, and selectively coupling a plurality of times to determine an optimum value for compensating the frequency response of the attenuator; and storing said optimum value in the memory element for future use.

17. A digital to capacitance converter, comprising:

a plurality of capacitors coupled in parallel, wherein the plurality of capacitors have weighted values;

a plurality of switches, wherein a switch is coupled to an input of each of the plurality of capacitors;

a memory element coupled to the plurality of switches, wherein the memory element stores a value which is operable to open/close selected switches, thereby configuring a capacitance value among the plurality of capacitors for impedance compensation.

18. The digital to capacitance converter of claim 17, wherein the plurality of capacitors are adapted to be coupled in parallel with a circuit to provide a selected impedance to the circuit.

19. The digital to capacitance converter of claim 17, wherein, in response to power up, the memory element is operable to output the value to the plurality of switches to open/close selected switches.

20. The digital to capacitance converter of claim 17, wherein the plurality of capacitors are binary weighted.

21. The digital to capacitance converter of claim 17, wherein the plurality of switches are microelectronic machined system (MEMS) switches.

22. The digital to capacitance converter of claim 17, wherein the memory element stores a binary value comprising 1s and 0s, wherein the 1s and 0s indicate whether respective switches should be opened or closed.

* * * * *